United States Patent [19]
Dinteman et al.

[11] Patent Number: 6,154,715
[45] Date of Patent: Nov. 28, 2000

[54] INTEGRATED CIRCUIT TESTER WITH REAL TIME BRANCHING

[75] Inventors: Bryan J. Dinteman, Canby; Daniel J. Bedell, Portland, both of Oreg.

[73] Assignee: Credence Systems Corporation, Fremont, Calif.

[21] Appl. No.: 09/232,098

[22] Filed: Jan. 15, 1999

[51] Int. Cl.[7] .................................................. G01R 31/307
[52] U.S. Cl. .......................... 702/120; 702/117; 702/119; 714/738; 714/742
[58] Field of Search .................................. 702/120, 57–59, 702/64–66, 69, 73, 81, 82, 108, 110, 112, 117–119, 121–123, 124, 126, 183–185, 189, FOR 170, FOR 171, FOR 110, FOR 103–FOR 106, FOR 134, FOR 138; 324/73.1, 537, 765–769, 555, 763, 523, 525; 714/718–720, 724, 730, 731, 728, 733, 734, 738–740, 742–744; 365/201

[56] References Cited

U.S. PATENT DOCUMENTS 5,790,411  8/1998  Nelson ..................................... 714/738
5,838,694  11/1998  Illes et al. ............................... 714/738
5,951,705  9/1999  Arkin et al. ............................. 714/738

*Primary Examiner*—Hal Wachsman
*Attorney, Agent, or Firm*—Daniel J. Bedell; Smith-Hill and Bedell

[57] ABSTRACT

An integrated circuit (IC) tester includes a set of digital and analog channels, each of which may be programmed to carry out a sequence of test activities at pins of an IC under test. The channels are interconnected by a trigger bus, and each channel may be programmed to respond to a detected event during a test by transmitting a particular trigger code to every other channel via the trigger bus. Each channel may be also programmed to respond to a particular trigger code arriving on the trigger bus by branching its sequence of test activities. Thus any channel detecting an event during a test can signal all other channels to immediately terminate a current sequence of test activities and branch to another set of test activities. Such a conditional branch capability enables the tester to automatically perform an "if/then" diagnostic test on an IC in which a test result detected at any point during the test determines the future course of the test.

7 Claims, 3 Drawing Sheets

INTEGRATED CIRCUIT TESTER WITH REAL TIME BRANCHING

BACKGROUND OF THE INVENTION

1. Field of the Invention

The present invention relates in general to integrated circuit (IC) testers and in particular to a tester providing flexible real time test branching in both analog and digital channels.

2. Description of Related Art

An integrated circuit (IC) tester may include both digital and analog channels. Each digital channel may either supply a digital test signal input to an IC under test or sample an IC output signal to determine whether it is of an expected state. Each analog channel may either supply an analog test signal input to the IC or may digitize an IC output signal to produce a representative waveform data sequence.

The digital portion of a test is organized into a succession of test cycles. Before the start of each test cycle a pattern generator supplies a vector (a data value) to each digital channel to tell the channel what to do during the test cycle. If the channel is to supply a test signal input to the IC, the vector tells the channel how and when to change the state of the test signal during the test cycle. If the channel is to sample an IC output signal during the test cycle, the vector tells the channel when during the test cycle to sample the IC output signal and also indicates an expected state of the IC output signal. Upon sampling an IC output signal, the channel determines whether the sampled IC output signal is of the expected state. If not, the channel asserts an output FAIL signal to indicate that the IC is defective. Typically a central processor monitors the FAIL signal output of each channel and logs the IC as defective when any channel produces a FAIL signal during the test. A FAIL signal produced by any one channel is sometimes also delivered to all other channels to tell them to immediately terminate the test and to await a START signal telling them to begin testing another IC. The sequence of digital test activities performed at each IC pin during a test is therefore completely predetermined by the sequence of vectors the pattern generators are programmed to supply to the tester's digital channels. During the test the only event that can affect the course of the test is the detection by a channel of an IC failure, and the only effect a failure detection can have on the test is to terminate it early.

An analog channel may include a waveform generator that may be programmed to supply a particular analog waveform as a test signal input to an IC pin, a digitizer that may be programmed to digitize an analog output signal at some particular rate, and an acquisition memory for storing the data sequence. An analog channel typically counts cycles of a clock signal marking test cycles and may be programmed to start or stop waveform generation or digitization when the count reaches various levels. However the activities carried out by an analog channel during a test are predetermined by the manner in which it is programmed and are not affected by test results.

An IC tester may have both digital and analog channels because some ICs include both analog and digital terminals. For example a digital-to-analog converter (DAC) converts an input digital waveform sequence into an output analog signal. To test an 8-bit DAC, we could use eight digital channels to supply an 8-bit waveform data input to the DAC and one digital channel to supply a clock signal to clock the 8-bit data into the DAC. We could employ one analog channel to digitize the DAC's analog output signal, thereby to produce a data sequence that can be analyzed. Analog channels sometimes include digital signal processors for analyzing the data they acquire. Suppose we want to test a DAC to determine the highest output signal frequency it can accurately produce. One way to do that is to program the tester to repeatedly test the DAC at increasingly higher frequencies until it arrives at a frequency for which the DAC's output signal fails meet expectations. However to determine the DAC's highest operating frequency with a high degree of resolution can require a large number of test repetitions.

It is possible to reduce the number of test repetitions by carefully selecting the sampling rate after each repetition. For example during a first repetition of the test the sampling rate may be set to a mid range value. If the DAC passes the first repetition, the test frequency for a second test repetition is increased by one fourth of its full range value. If the DAC fails the first repetition of the test, the test frequency for the second repetition is decreased by one fourth of its full range value. For the third repetition, the test frequency is increased or decreased by one eighth of its full range value depending on the pass/fail result of the second repetition. When the process is continued, with increasingly smaller adjustments to the test frequency for each successive repetition, the tester can quickly zero in on the DAC's highest frequency in a relatively few test repetitions. One problem with this method, however, is that it requires a host computer to reprogram the tester before each test repetition in order to set the test frequency based on test results of the preceding repetition. The need to reprogram and restart the tester channels for each test repetition can greatly lengthen the test process.

What is needed is an integrated circuit tester having digital and analog channels for carrying out a test on an IC that may conditionally branch at various points during the test depending on previous test results. Such channels could perform a sequence of test repetitions in which parameters of each test repetition are set depending on the results of a preceding test repetition without having to be stopped, reprogrammed, and restarted after each test repetition.

SUMMARY OF THE INVENTION

An integrated circuit (IC) tester in accordance with the present invention includes a set of digital and analog channels, each of which may be programmed to carry out a sequence of test activities at pins of an IC under test. The channels are interconnected by a trigger bus, and each channel may be programmed to respond to a detected event during a test by transmitting a particular trigger code to every other channel via the trigger bus. Each channel may be also programmed to respond to a particular trigger code arriving on the trigger bus by branching its sequence of test activities. Thus any channel detecting an event during a test can signal all other channels to immediately terminate a current sequence of test activities and branch to another set of test activities. Such a conditional branch capability enables the tester to automatically perform an "if/then" diagnostic test on IC in which a test result detected at any point during the test determines the future course of the test.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENTS

Figure 1:
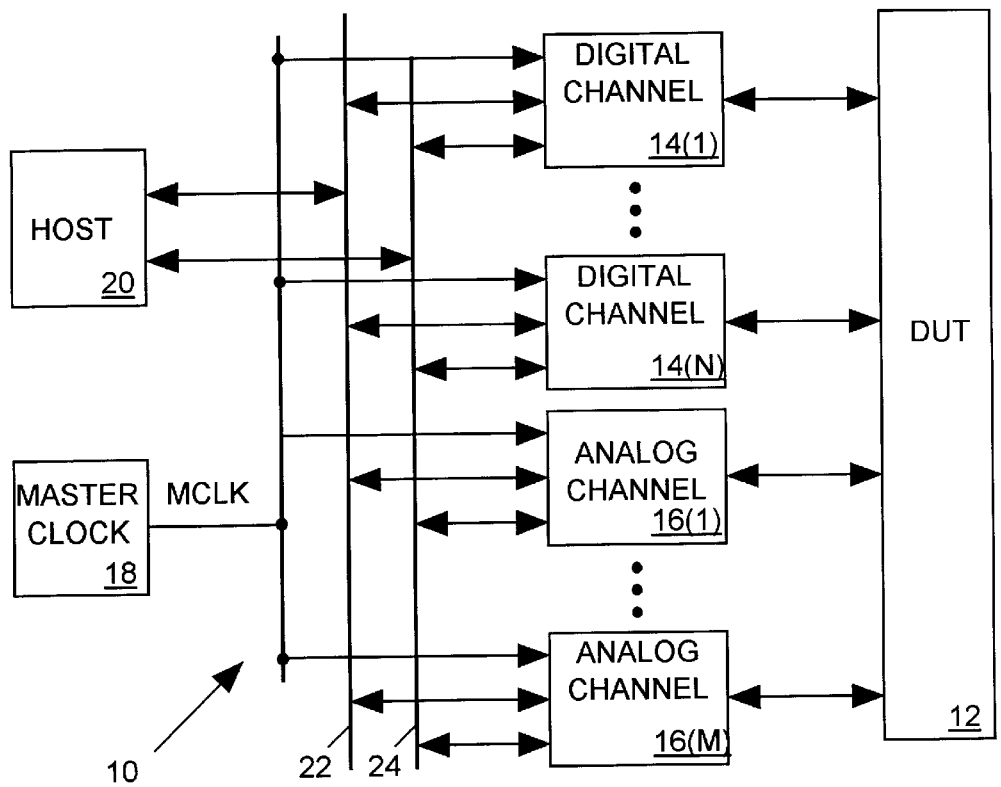
FIG. 1 illustrates in block diagram form an integrated circuit (IC) tester in accordance with the present invention.

FIG. 1 illustrates in block diagram form an integrated circuit (IC) tester 10 in accordance with the present invention for testing an IC device under test (DUT) 12. Tester 10 includes a set of digital channels 14 and a set of analog channels 16, each for carrying out test activities at a separate digital or analog I/O pin of DUT 12. During a test, a digital channel 14 may either transmit a digital test signal input to DUT 12 or may sample a digital output signal of DUT 12 and may determine if it is of an expected state. An analog channel 16 may transmit an analog input signal to DUT 12 or may digitize a DUT analog output signal to produce digital waveform data stored in an internal acquisition memory. An analog channel 16 may also be programmed to analyze the acquired digital waveform data to determine if it matches expectations. Tester 10 also includes a master clock signal generator 18 for supplying a master clock signal MCLK to all channels 14 and 16 for synchronizing their test activities and a host computer 20.

Before the start of the test, host computer 20 supplies programming data to each channel 14 and 16 via a conventional computer bus 22. After programming channels 14 and 16, host computer 20 sends a START code to the channels via a trigger bus 24. The channels then carry out the test on DUT 12. During a test, any digital channel 14 may send a FAIL code via bus 24 to host computer 20 when it determines a digital output signal of DUT 12 is not of an expected state. At the end of a test, one of channels 14 sends an END code to host computer 20 via bus 24. At that point host computer 20 may use bus 22 to access acquisition memories within digital channels 14 or analog channels 16 to acquire and analyze any waveform data or analysis results the channels have generated during the test.

In accordance with the invention trigger bus 24 also allows channels 14 and 16 to communicate with one another during a test. When one channel 14 or 16 detects an event, that channel may send a trigger code concurrently to all other channels 14, 16 via trigger bus 24. Some or all of the receiving channels can be programmed to respond to that trigger code by branching the course of their test activities. For example, when one analog channel 16 detects a level crossing in a DUT output signal, it may signal a digital channel 14 or another analog channel 16 to begin or end sampling or digitizing another DUT output signal.

Figure 2:
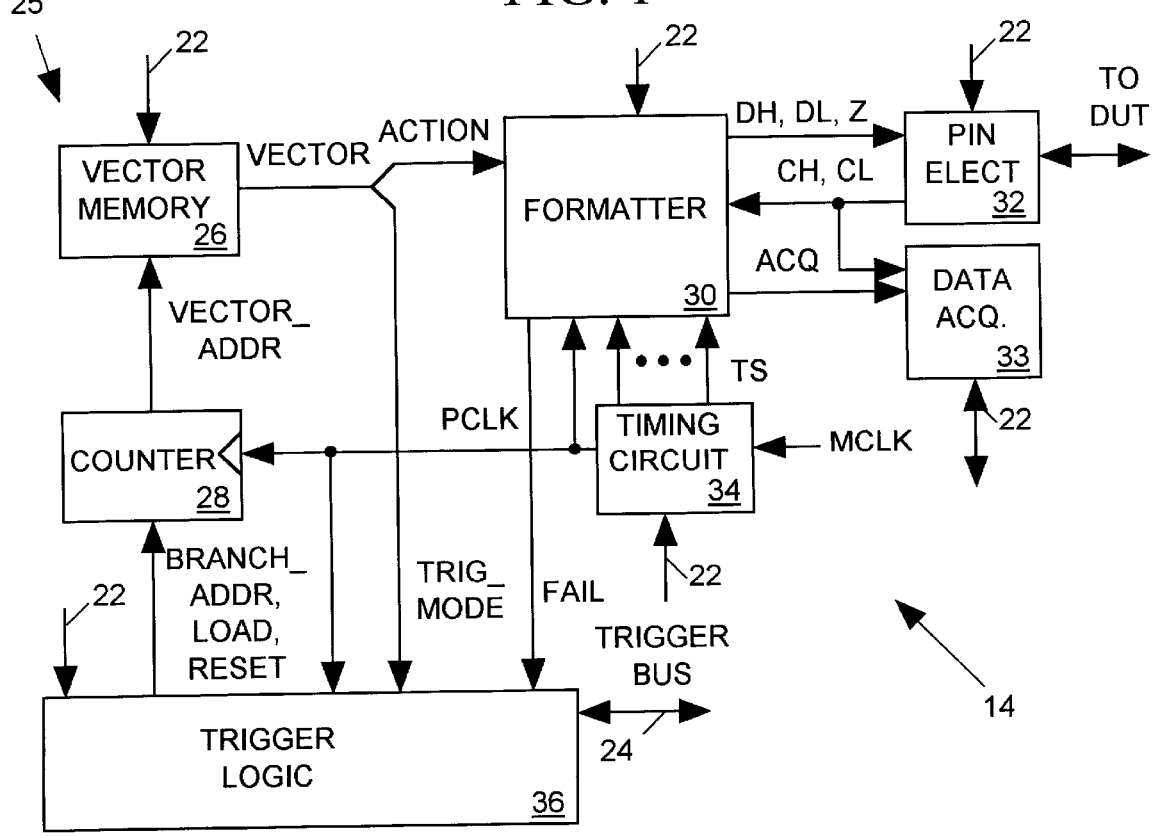
FIG. 2 illustrates a digital channel of FIG. 1 in more detailed block diagram form.

FIG. 2 illustrates one of digital channels 14 of FIG. 1 in more detailed block diagram form. Digital channel 14 organizes a test into a succession of test cycles, and during each test cycle channel 14 may either change the state of a digital test signal input to DUT 12, may sample a DUT output signal to determine whether it is of an expected state, or may store data indicating the state of the output signal. Before each test cycle a pattern generator 25 within channel 14 generates a vector (an instruction) indicating what the channel is to do during the test cycle.

Pattern generator 25 includes a counter 28 and a random access vector memory 26. Vector memory 26 stores a vector at each address and reads that vector out when addressed by the count output of counter 28 (VECTOR_ADDR). Host computer 20 of FIG. 1 writes vectors into vector memory 26 via bus 22 when programming the channel. Vector memory 26 normally stores vectors in the general order in which they are to be used during the test. At the start of the test a RESET signal input to counter 28 sets its output count to 0 so that vector memory 26 reads out the vector at address 0. Prior to each test cycle thereafter, counter 28 normally responds to an input period clock signal PCLK by incrementing its count so that vector memory 26 reads out the vector at a next address. However in response to an input LOAD signal counter 28 sets its current output count to a value indicated by an input branch address (BRANCH_ADDR), thereby causing the vector memory address to branch. For example a test may involve several phases or segments, and a vector sequence for the separate test segments are stored as separate sets of vector memory 26 addresses. Channel 14 can be made to jump from any point in a first test segment to the start of a second test segment by setting the branch address BRANCH_ADDR to the address of the first vector of the second segment into counter 28 and then pulsing the LOAD signal to set the vector memory addresses VECTOR_ADDR to the branch address.

The vector output of vector memory 26 includes an ACTION field supplied to a conventional formatter circuit 30. Formatter 30 supplies a set of three control signals DH, DL and Z to a conventional pin electronics circuit 32. A DH signal pulse tells pin electronics circuit 32 to drive a digital test signal input to DUT 12 to a high logic level while a DL signal pulse tells pin electronics circuit 32 to drive the test signal to a low logic level. A pulse of the Z signal tells pin electronics circuit 32 to tristate the test signal. Pin electronics circuit 32 supplies two indicating signals, CH and CL to formatter 30 and to a data acquisition system 33. The CH signal indicates whether a signal at the DUT pin is above a high logic level and the CL signal indicates whether the signal at the DUT is below a low logic level. Host computer 20 supplies control data defining the high and low logic levels to pin electronics circuit 32 when programming channel 14.

The ACTION field supplied as input to formatter 30 before the start of each test cycle indicates whether formatter 30 is to pulse one of the DH, DL or Z control signals and, if so, indicates a time during the test cycle at which formatter 30 is to pulse the control signal. If channel 14 is to monitor a DUT output signal, the ACTION field input to formatter 30 indicates a time during the cycle at which it is to sample the CH and CL signals and indicates expected states of the CH and CL signals. If formatter 30 determines that the CH and CL signals are not of the expected states indicated by the ACTION field, it pulses an output FAIL signal. Data acquisition system 33 includes an internal memory for storing sequences of CH and CL data bits generated by pin electronics circuit 32. At the end of a test host computer 20 may read the acquired data out of acquisition system 33 via bus 22 for subsequent analysis. During the test the ACTION field may indicate that data acquisition system 33 is to store the CH and CL bits at some time during a test cycle. If so, formatter 30 transmits an ACQ signal to acquisition system 33 causing it to store the CH and CL bits in its internal memory. Host computer 20 of FIG. 1 supplies control data to formatter 30 when programming channel 14 to tell it how to respond to each ACTION field data value.

A conventional timing circuit 34 programmed by host computer 20 via bus 22 produces the period clock PCLK input to counter 28 using the master clock signal MCLK as a timing reference. Timing circuit 34 also supplies a set of distributed phase timing signals TS to formatter 30. Each timing signals TS marks a different time during each test cycle and formatter 30 selects one of timing signals TS to trigger each of its actions. Timing circuit 34 also supplies the period clock signal to formatter 30 to tell it when a next ACTION field input is available.

In accordance with the invention, a trigger logic circuit 36 is programmed by host computer 20 via bus 22. Each vector read out of vector memory 26 also includes a "trigger mode" data field (TRIG_MODE) supplied as input to trigger logic circuit 36. Trigger logic circuit 36 also receives the FAIL signal output of formatter 30 and receives trigger codes arriving from other channels 14, 16 of FIG. 1 via the trigger bus 24. Trigger logic circuit 36 responds to its input data by controlling the BRANCH_ADDR, LOAD and RESET signal inputs to counter 28 and by sending trigger codes outward on trigger bus 24. In response to a START code arriving on trigger bus 24, trigger logic circuit 36 pulses the RESET signal input to counter 28 to reset its count to 0. Trigger logic circuit 36 may be programmed to respond to a particular TRIG_MODE data value by monitoring trigger codes arriving on trigger bus 24 and loading a particular branch address into counter 28 on detection of a particular trigger code. This is the mechanism by which channel 14 is able to branch to a new segment of a test in response to an event detected by some other channel 14 or 16 of FIG. 1. Trigger logic circuit 36 can also be programmed to respond to a particular VECTOR data value by sending a predetermined trigger code outward on trigger bus 24 to the host computer 20 and other channels 14, 16 if the FAIL signal is asserted during the test cycle. Thus when channel 14 detects a DUT output signal failure, it can signal other channels to terminate a current segment of a test branch to a new segment. Trigger logic circuit 36 may also be programmed to send a trigger code outward on trigger bus 24 in response to any particular TRIG_MODE value. For example the TRIG_MODE field of the vector at the end of a test may signal trigger logic circuit 36 to send a trigger code to host computer 20 telling it that the test has ended.

Figure 3:
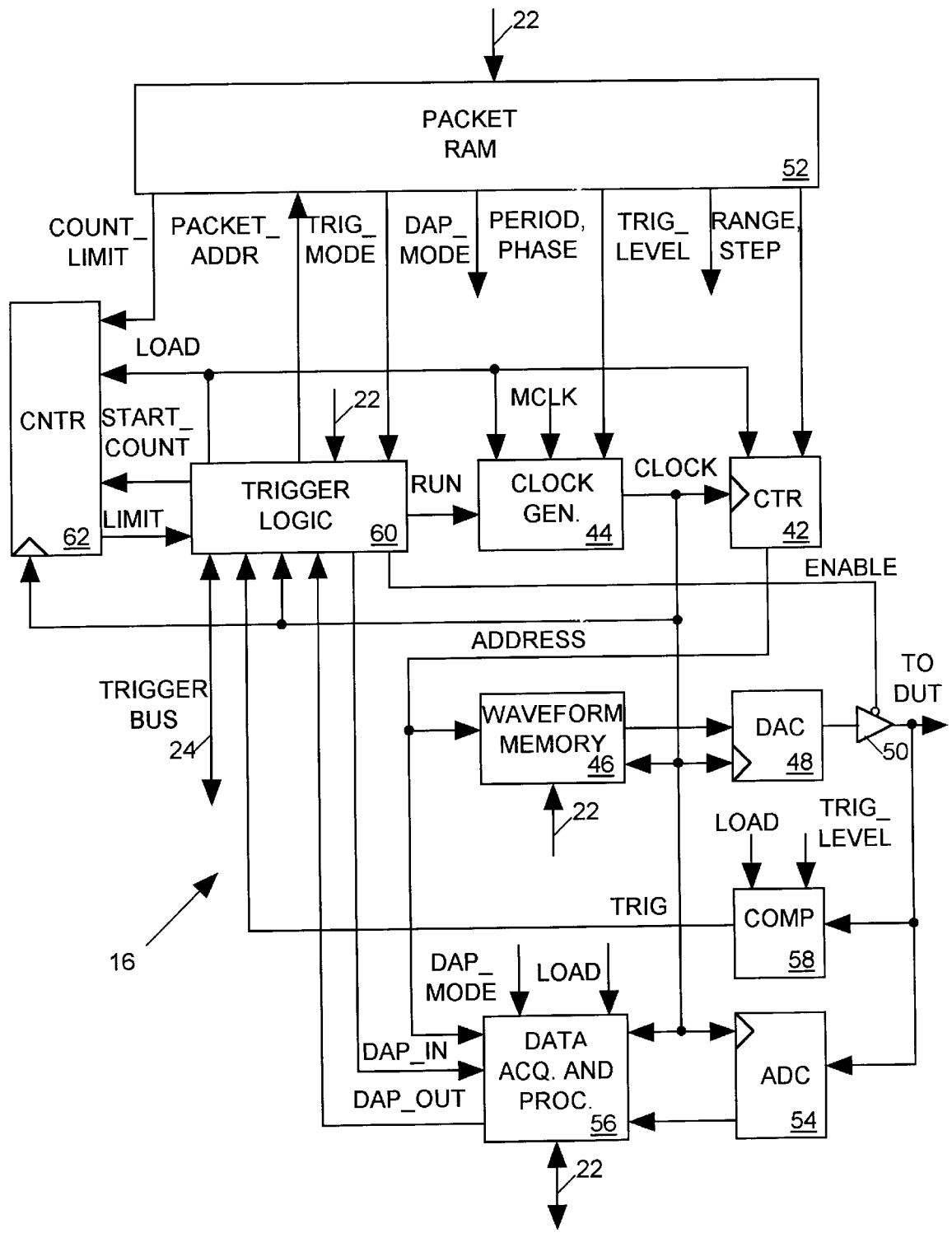
FIG. 3 illustrates an analog channel of FIG. 1 in more detailed block diagram form.

FIG. 3 illustrates one of analog channels 16 of FIG. 1 in more detailed block diagram form. Channel 16 includes a counter 42 for counting pulses of a CLOCK signal produced by a clock signal generator 44. The output count produced by counter 42 is supplied as an address input (ADDRESS) to a waveform memory 46. When programming channel 16, host computer 20 of FIG. 1 writes data into waveform memory 46 via bus 22. During the test, as the ADDRESS output of counter 42 changes its value, waveform memory 46 reads out a data sequence to a digital-to-analog converter (DAC) 48 clocked by the CLOCK signal. DAC 48 supplies an analog test signal to DUT 12 of FIG. 1 via a driver 50 when the driver is enabled by an input ENABLE signal.

On each pulse of the CLOCK signal, an analog-to-digital converter (ADC) 54 digitizes the signal appearing at the DUT terminal to produce a digital waveform data input to a data acquisition and processing (DAP) unit 56. DAP unit 56 includes a conventional random access memory for storing sequences of data produced by ADC 54 at the address indicated by the ADDRESS output of counter 42 and may also include conventional data processing equipment, such as for example programmable digital signal processing circuits, a microcomputer, and/or dedicated logic, for analyzing the acquired data to determine the character of the DUT output signal. Host computer 20 of FIG. 1 communicates with DAP unit 56 via bus 22 to provide programming input to DAP unit 56 to obtain acquired waveform data, and to acquire data processing results. When DAP unit 56 is programmed for several modes of operation, input DAP_MODE data selects the current operating mode. DAP unit 56 synchronizes its data acquisition and processing activities to the CLOCK signal output of clock generator 44.

Channel 16 also includes a comparator 58 for asserting an output TRIG signal whenever the signal appearing at the DUT terminal exceeds a level indicated by input trigger level data (TRIG_LEVEL).

During the test, a random access memory (RAM) 52 reads out a packet of data including fields for controlling operations of various other components of channel 16. PERIOD and PHASE data fields supplied to clock generator 44 define the phase and frequency of the CLOCK signal relative to the MCLK signal. RANGE and STEP fields tell counter 42 the upper and lower limits of the range of addresses it is to generate and indicate the step size by which it to increment its output address in response to each CLOCK signal pulse. A TRIG_LEVEL field and a DAP_MODE field provide the control inputs to comparator 58 and DAP unit 56.

A trigger logic circuit 60, programmed by host computer 20 of FIG. 1 via bus 22, receives trigger codes via trigger bus 24, receives the TRIG signal produced by comparator 58, and may also receive output signals or codes (DAP_OUT) produced by DAP unit 56. In response to its inputs, trigger logic circuit 60 supplies an input address PACKET_ADDR to packet RAM 52 to tell it which of its stored packets of data to read out. For example, trigger logic circuit 60 responds to a START trigger code from host computer 20 by setting the input address PACKET_ADDR to packet RAM 52 to 0 so that the packet RAM 52 reads out the data packet stored at address 0. Trigger logic circuit 60 may also respond to an input signal or trigger code by transmitting a particular trigger code outward on trigger bus 24.

The packet read out of RAM 52 includes a TRIG_MODE field provided as input to trigger logic circuit 60, the TRIG_MODE field indicating the actions trigger logic circuit 60 may take in response to its various inputs. For example, trigger logic circuit 60 may respond to an input code on the trigger bus 24 by asserting or deasserting the ENABLE input to driver 50 to enable or tristate drive 50, by supplying an input control code (DAP_IN) to DAP unit 56 to initiate or terminate a data acquisition or processing operation, or by changing the address input to packet RAM 52 so that it reads out another packet for controlling a next phase of a test.

Inputs to trigger logic circuit 60 also include a LIMIT signal produced by a counter 62. Counter 62 loads a COUNT_LIMIT field output of packet RAM 52 in response to a LOAD signal pulse from trigger logic circuit 60. When trigger logic circuit 60 thereafter produces a START_COUNT signal pulse, counter 62 counts pulses of the CLOCK signal. When the count reaches the value indicated by the COUNT_LIMIT data, counter 62 drives the LIMIT signal true.

Each packet stored in RAM 52 may control a different phase or segment of a test to be carried out by channel 16. The TRIG_MODE input to trigger logic 60 tells it the conditions under which it may branch channel 16 to a different test segment by re-addressing RAM 52. A branch can occur in response to a particular trigger code arriving from another channel via trigger bus 24, in response to a change in state of the TRIG signal output of comparator 58, in response to the LIMIT signal input to trigger logic circuit 60, or in response to a particular DAP_OUT code produced by DAP unit 56.

Figure 4:
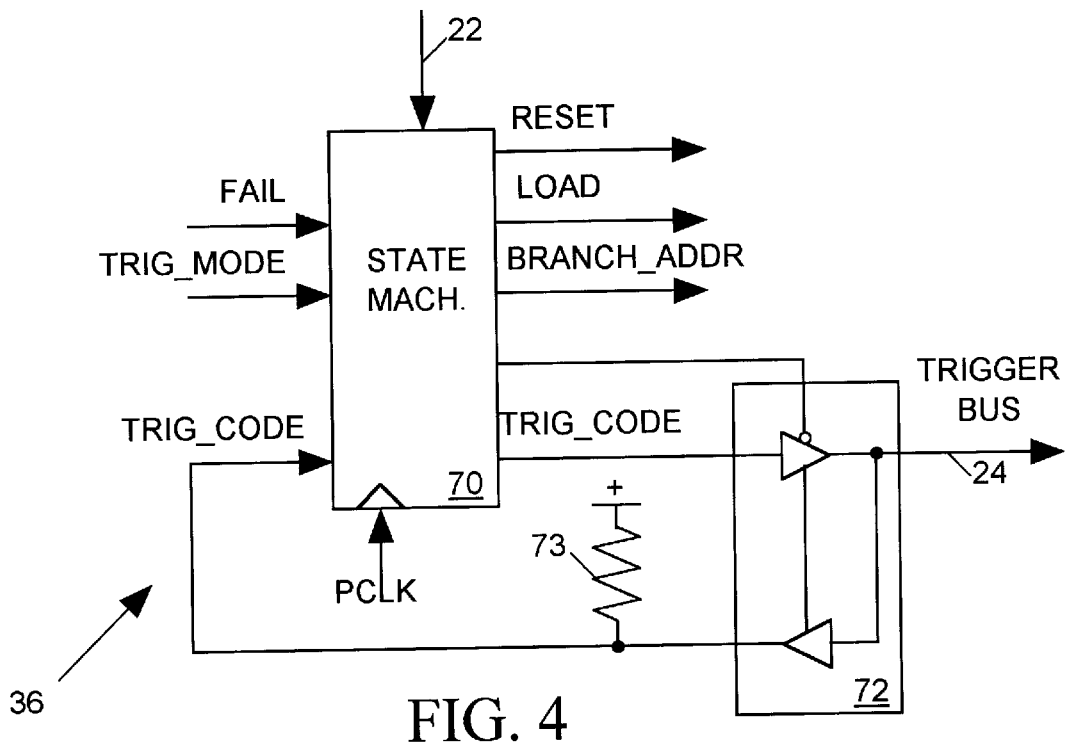
FIG. 4 illustrates the trigger logic circuit of the digital channel of FIG. 2 in more detailed block diagram form.

FIG. 4 illustrates trigger logic circuit 36 of the digital channel 14 of FIG. 2 in more detailed block diagram form. Trigger logic circuit 36 includes a conventional state machine 70 and a bi-directional tristate driver 72. Host computer 20 of FIG. 1 programs state machine 70 via supplying it with programming data via bus 22. Referring to FIGS. 2 and 4, state machine 70 receives as input the combination of the TRIG_MODE output of vector memory 26, the FAIL signal output of formatter 30 and trigger codes arriving via trigger bus 24 and driver 72. A set of resistors 73 pull each bit of the TRIG_CODE input to state machine 70 weakly high except when driver 72 is set to allow low logic level bits of an incoming trigger code on bus 24 to pull them down. Output data produced by state machine 70 includes bits supplied as the RESET, BRANCH_ADDR and LOAD signal inputs to counter 28, and a trigger code (TRIG_CODE) that may be sent out of trigger bus 24 via driver 72. An additional output bit of state machine 70 controls the direction of driver 72. Each state of state machine 70 may correspond to a separate test segment, and the programming data supplied by host computer 20 via bus 22 determines the manner in which it controls its output signals during a test segment in response to its input signals.

Figure 5:
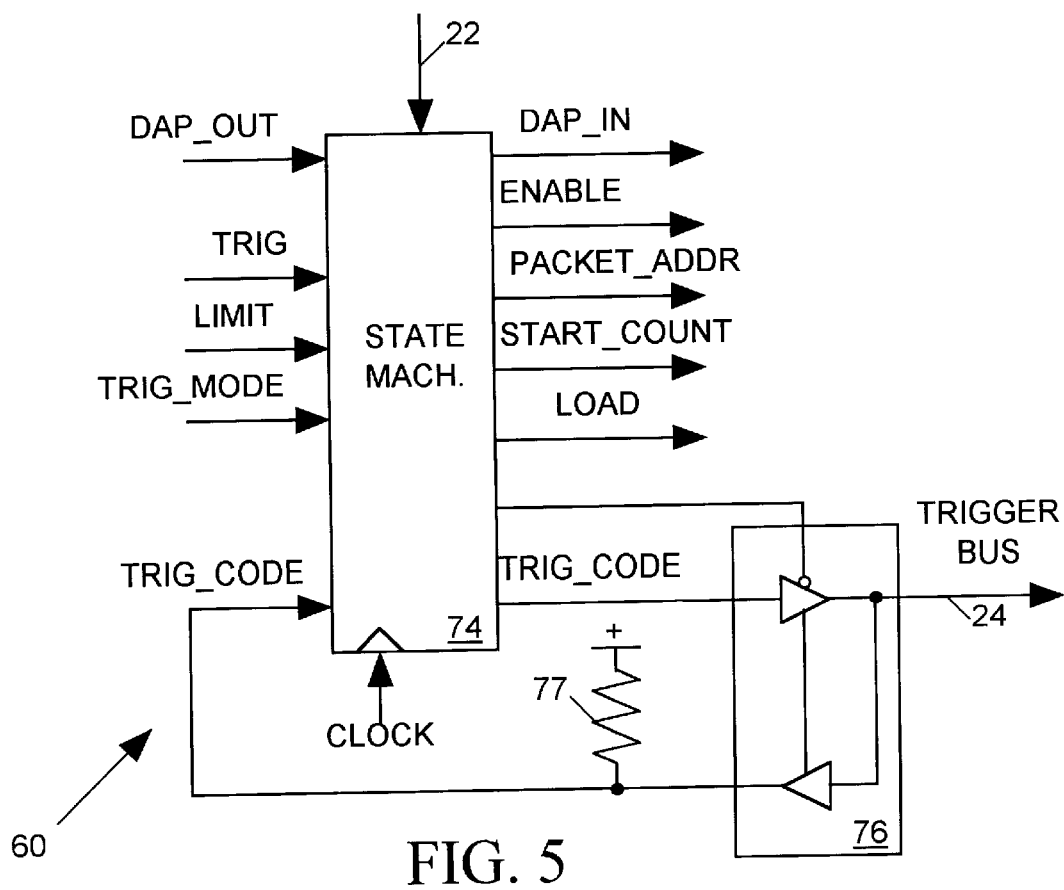
FIG. 5 illustrates the trigger logic circuit of the analog channel of FIG. 3 in more detailed block diagram form.

FIG. 5 illustrates trigger logic circuit 60 of the analog channel 16 of FIG. 3 in more detailed block diagram form. Trigger logic circuit 60, generally similar to trigger logic circuit 36 of FIG. 4, includes a conventional state machine 74, a bidirectional driver 76 and a set of resistors 77. Host computer 20 of FIG. 1 also programs state machine 74 via bus 22. Referring to FIGS. 3 and 5, inputs to state machine 74 include the TRIG_MODE output of packet RAM 52, the TRIG signal output of comparator 58, the DAP_OUT output of DAP unit 56, the LIMIT signal output of counter 62, and the trigger code arriving via trigger bus 24 and driver 76. The data outputs of state machine 74 include the DAP_IN and ENABLE inputs to DAP unit 56 and waveform memory 46, the START_COUNT and LOAD signal inputs to counter 62 of FIG. 3 and a trigger code (TRIG_CODE) that may be sent out of trigger bus 24 via driver 76. An additional bit read out of state machine 74 controls the direction of driver 76.

Tester 10 is particularly well adapted to performing an "if/then" diagnostic test on a DUT in which the future course of the test is affected by past results. State machines 70 and 74 of the trigger logic circuits 36 and 60 (FIGS. 4 and 5) of each channel 14 or 16 may be programmed to carry out "if/then" logic during each segment of a test by which they select a next segment of the test based on the events occurring during a current test segment as indicated by their input signals.

For example DUT 12 of FIG. 1 could be a digital-to-analog converter (DAC) for converting an 8-bit digital waveform into an analog output signal. One way to test a DAC is to supply it with an input digital sine wave, sample its analog output signal to produce a data sequence, and then use conventional digital signal processing techniques to analyze the data sequence to determine whether the DAC output signal behaves as expected. Suppose we want to test the DUT to determine the highest frequency sine wave that it can generate. One way to quickly find the DAC's highest operating frequency is to first supply it with an input data sequence that should cause the DAC to produce an output signal of frequency at 50% of the full range frequency for which the DAC is to be tested. The DAC output signal is then digitized and analyzed to determine whether the DAC has behaved as expected. If the DAC output signal meets expectations, then the input signal frequency is increased to 75% of full range and the DAC is retested. However if the DAC output signal does not meet expectations, the input signal frequency is decreased to 25% of full range and the test is repeated. By iteratively increasing or decreasing the test frequency by progressively smaller steps, the tester can quickly zero in on the maximum DAC operating frequency in relatively few iterations.

To program tester 10 to perform such an iterative test on a DAC, host computer 20 programs a set of eight digital channels 14(1)–14(8) to supply the 8-bit input waveform sequences to DUT 12 and programs one digital channel 14(9) to provide a clock signal input to DUT 12. To program channels 14(1)–14(9), host computer 20 writes several vector sequences into separate areas of each channel's vector memory 26 (FIG. 2). Each vector sequence corresponds to a separate digital test signal frequency. Host computer 20 also programs the trigger logic 36 (FIG. 2) of each digital channel 14(1)–14(9) so that it will jump to the starting address of any particular vector sequence depending on the value of a trigger code arriving on trigger bus 24.

Host computer 20 also programs analog channel 16(1) to digitize and analyze the DUT's analog output signal at the various frequencies. In doing so host computer 20 programs the channel's DAP unit 56 (FIG. 3) to acquire the data and carry out the analysis in response to an input DAP_IN code and to produce an output DAP_OUT code indicating whether the DUT passes or fails the analysis. Since each test frequency requires a different sampling frequency, host computer 20 also writes a separate packet into the channel's packet RAM 52 (FIG. 3) for each test frequency, each packet including a unique PERIOD data value controlling the sampling frequency. Host computer 20 programs trigger logic circuit 60 to respond to DAP_OUT data indicating whether the system passes or fails by forwarding an appropriate code outward to the digital channels on TRIGGER bus 24 to tell them whether to increase or decrease the test frequency.

The trigger logic state machines 70 and 74 of all channels are programmed to respond to a START trigger code on trigger bus 24 by initiating a first test segment in which the test frequency is set to 50% of its full range value. During the first test segment, if the DAP unit 56 of analog channel 16(1) determines that the output signal of DUT 12 does not meet expectations, it sends generate a FAIL signal code on its DAP_OUT lines to tell trigger logic circuit 60 to send a FAIL trigger code outward to the digital channels on trigger bus 24. The trigger logic circuits 36 (FIG. 2) of all digital channels respond to the FAIL trigger code by signaling their local counters 28 to branch the vector memory 26 address of the first vector of a sequence for a test segment for which the sampling clock frequency is set to 25% of full range value. The DAP_OUT code also tells trigger logic circuit 60 of FIG. 3 to set the address of packet RAM 52 so that it reads out a packet that sets the sampling frequency to 25% full range sampling clock frequency. Tester 10 then performs the next segment of the test at the 25% of full range sampling rate.

If DUT 12 passes the first test segment at the 50% of full range frequency, the DAP_OUT code produced by DAP unit 56 tells trigger logic circuit 60 to send out a PASS code on the trigger bus 24 and to branch to a packet RAM address for which sampling rate is 75% of full range value. The PASS code on the trigger bus trigger logic circuit 36 (FIG. 2) of the digital channels to jump to a vector memory address containing the first vector of the vector sequence for the 75% full range test frequency.

Tester 10 then performs the selected second test segment, either at the 25% or 75% of full range test frequency. If DUT 12 test fails during the second segment, the channels branch to a test segment that is decreased by one eighth of the full range sampling frequency. For example if the test fails at the 25% level, the 12.5% full range segment is selected. If the test fails at the 75% level, the 67.5% of full range level is selected. One the other hand if DUT 12 passes the second segment of the test at either the 25% or 75% of full range value, the channels branch to a test segment for which sampling frequency is increased by one eighth of full range value to either 37.5% or 87.5% of full range value. When the process is continued, with increasingly smaller adjustments to the sampling rate for each successive test segment, the tester quickly zeros in on the DAC's highest operating frequency after having carried out a relatively few test segments. Host computer 20 can determine the highest sampling frequency for which DUT 12 operates correctly by monitoring the trigger codes appearing on trigger bus 24. Note however that host computer 20 does not have to analyze results or reprogram channels 14 or 16 between test segments.

Thus has been shown and described an integrated circuit tester capable of carrying out an "if/then" type diagnostic test on an integrated circuit in which at various times during the test, the future course of the test is determined in response to past results of the test. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for performing a test on an integrated circuit having a plurality of terminals, wherein the test is organized into a plurality of test segments, the apparatus comprising:
    a trigger bus; and
    a plurality of tester channels interconnected by said trigger bus, each tester channel being connected to a separate terminal of said plurality of IC terminals and concurrently storing instructions for carrying out test activities at said separate terminal for each of said plurality of test segments,
    wherein said test activities include generating a test signal and detecting events in an IC output signal,
    wherein during one of said plurality of test segments, one of said plurality of tester channels transmits a trigger code concurrently to others of said plurality of tester channels via said trigger bus upon detecting a particular event in said IC output signal, and
    wherein others of said plurality of tester channels respond to said trigger code by branching to and executing instructions for another one of said plurality of test segments.

2. The apparatus in accordance with claim 1 wherein at least one of said plurality of tester channels is a digital channel for producing a digital test signal input to said IC, and wherein at least one other of said plurality of tester channels is an analog channel for producing an analog test signal input to said IC.

3. The apparatus in accordance with claim 1 wherein at least one of said plurality of tester channels is a digital channel comprising:

a vector memory for concurrently storing a separate set of addressable vectors for each of said plurality of test segments, each addressable vector comprising an instruction referencing one of said test activities, said vector memory reading out each addressable vector when addressed by an input address;

testing means connected to said separate terminal for receiving each addressable vector read out of said vector memory, for carrying out test activities indicated by addressable vectors read out of said vector memory;

means for generating a periodic clock signal;

addressing means for incrementing said input address to said vector memory in response to pulses of said periodic clock signal and for responding to a pulse of an input LOAD signal by setting said input address to an input branch address;

a trigger logic circuit for receiving trigger codes arriving on said trigger bus and for responding to a trigger code arriving on said trigger bus by supplying said branch address input to said addressing means and pulsing said input LOAD signal.

4. The apparatus in accordance with claim 1 wherein at least one of said plurality of tester channels is a digital channel comprising:

a vector memory for concurrently storing a separate set of addressable vectors for each of said plurality of test segments, each addressable vector comprising an instruction referencing one of said test activities, said vector memory reading out each addressable vector when addressed by an input address, testing means connected to said separate terminal for receiving each addressable vector read out of said vector memory, for carrying out said test activities indicated by addressable vectors read out of said vector memory, wherein one of said test activities includes pulsing an indicating signal in response to said particular event in said IC output signal appearing at said IC terminal;

means for generating a periodic clock signal, addressing means for incrementing said input address to said vector memory in response to pulses of said periodic clock signal and for responding to a pulse of an input LOAD signal by setting said input address to an input branch address;

a trigger logic circuit for receiving and responding to said indicating signal by transmitting a trigger code via said trigger bus to others of said plurality of tester channels.

5. The apparatus in accordance with claim 1 wherein at least one of said plurality of tester channels is a digital channel comprising:

a vector memory for concurrently storing a separate set of addressable vectors for each of said plurality of test segments, each addressable vector comprising an instruction referencing one of said test activities, said vector memory reading out each addressable vector when addressed by an input address, testing means connected to said separate terminal for receiving each addressable vector read out of said vector memory, for carrying out said test activities indicated by addressable vectors read out of said vector memory, wherein one of said test activities includes pulsing an indicating signal in response to said particular event in said IC output signal appearing at said IC terminal;

means for generating a periodic clock signal, addressing means for incrementing said input address to said vector memory in response to pulses of said periodic clock signal and for responding to a pulse of an input LOAD signal by setting said input address to an input branch address;

a trigger logic circuit for transmitting and receiving trigger codes on said trigger bus, for responding to a first trigger code arriving via said trigger bus by supplying said branch address input to said addressing means and pulsing said input LOAD signal, and for receiving and responding to said indicating signal by transmitting a second trigger code to others of said plurality of tester channels via said trigger bus.

6. The apparatus in accordance with claim 5 wherein at least one other of said plurality of tester channels is an analog channel comprising:

a packet memory for storing a plurality of addressable data packets, each addressable data packet referencing a test activity, said packet memory reading out each addressable data packet when addressed by an input address;

analog test signal generation and analog IC output signal monitoring means connected to said separate terminal for responding to addressable data packets read out of said packet memory and by carrying out test activities referenced by said addressable data packets, wherein said test activities referenced by said addressable data packets include generating an indicating signal in response to an event occurring in an analog signal output of said IC at said separate terminal and wherein at least one other test activity reference by received addressable data packets includes transmitting an analog test signal input to said separate terminal; and trigger logic means for receiving each trigger code transmitted on said trigger bus, for receiving said indicating signal, and for receiving and responding to packet data read out of said packet memory by generating an input address to said packet memory upon detecting a first trigger code arriving on said trigger bus and by transmitting a second trigger code to others of said channels via said trigger bus in response to said indicating signal.

7. The apparatus in accordance with claim 1 wherein at least one of said plurality of tester channels is an analog channel comprising:

a packet memory for storing a plurality of addressable data packets, each addressable data packet referencing a test activity, said packet memory reading out each addressable data packet when addressed by an input address;

analog test signal generation and analog IC output signal monitoring means connected to said separate terminal for responding to addressable data packets read out of said packet memory and by carrying out test activities referenced by said addressable data packets, wherein said test activities referenced by said addressable data packets include generating another indicating signal in response to an event occurring in an analog signal output of said IC at said separate terminal and wherein at least one other test activity reference by received addressable data packets includes transmitting an analog test signal input to another of said plurality of IC terminals; and trigger logic means for receiving each trigger code transmitted on said trigger bus, for receiving said another indicating signal, for responding to packet data read out of said packet memory by generating an input address to said packet memory upon detecting a first trigger code arriving on said trigger bus and by transmitting a second trigger code to others of said channels via said trigger bus in response to said indicating signal.

* * * * *